United States Patent
Kim

(10) Patent No.: US 7,642,156 B2
(45) Date of Patent: Jan. 5, 2010

(54) THREE-DIMENSIONAL FLASH MEMORY CELL

(75) Inventor: Seong-Gyun Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 220 days.

(21) Appl. No.: 11/781,001

(22) Filed: Jul. 20, 2007

(65) Prior Publication Data

US 2008/0017918 A1     Jan. 24, 2008

(30) Foreign Application Priority Data

Jul. 24, 2006   (KR)   ............. 10-2006-0068974

(51) Int. Cl.
*H01L 21/20* (2006.01)
(52) U.S. Cl. ............... 438/253; 438/257; 438/258; 438/264; 438/265; 438/266; 257/E21.009; 257/E21.011; 257/E21.175; 257/E21.294; 257/E21.689; 257/E23.002; 257/E23.134; 257/E27.102; 257/E29.129
(58) Field of Classification Search ......... 438/253–266, 438/296, 559; 257/E21.009, 11, 175, 294, 257/649, 682, E23.002, 134, E27.103, E29.129
See application file for complete search history.

(56) References Cited

U.S. PATENT DOCUMENTS

| | | | | | |
|---|---|---|---|---|---|
| 5,932,910 | A | * | 8/1999 | Hong | 257/321 |
| 5,972,752 | A | * | 10/1999 | Hong | 438/264 |
| 6,037,223 | A | * | 3/2000 | Su et al. | 438/257 |
| 6,294,425 | B1 | * | 9/2001 | Hideki | 438/253 |
| 6,486,506 | B1 | * | 11/2002 | Park et al. | 257/314 |
| 2002/0127798 | A1 | * | 9/2002 | Prall | 438/257 |
| 2004/0018687 | A1 | * | 1/2004 | Hsieh et al. | 438/266 |
| 2004/0196720 | A1 | * | 10/2004 | Hung et al. | 365/222 |
| 2004/0262668 | A1 | * | 12/2004 | Wang | 257/315 |
| 2006/0273370 | A1 | * | 12/2006 | Forbes | 257/302 |
| 2007/0148830 | A1 | * | 6/2007 | Kim | 438/142 |
| 2008/0153223 | A1 | * | 6/2008 | Liu et al. | 438/257 |
| 2009/0200536 | A1 | * | 8/2009 | Van Schaijk et al. | 257/4 |

* cited by examiner

*Primary Examiner*—Michael S Lebentritt
(74) *Attorney, Agent, or Firm*—Sherr & Vaughn, PLLC

(57) ABSTRACT

Embodiments relate to a three-dimensional flash memory cell and method of forming the same that may be improve the uniformity of flash memory cell by removing a width difference of a polysilicon pattern when forming a floating gate of flash memory device, to thereby improve the reliability of semiconductor device. The process may be simplified due to the self-alignment in the step of forming the polysilicon pattern, which may improve the yield.

14 Claims, 3 Drawing Sheets

THREE-DIMENSIONAL FLASH MEMORY CELL

The present application claims priority under 35 U.S.C. 119 and 35 U.S.C. 365 to Korean Patent Application No. 10-2006-0068974 (filed on Jul. 24, 2006), which is hereby incorporated by reference in its entirety.

BACKGROUND

A flash memory may be a memory device that stores data, and may be beneficial in that data (for example, stored information) may not be lost during an interruption of power to the device. In this respect, the flash memory may be referred to as a nonvolatile memory. In the area of nonvolatile memory, the flash memory may be different from Dynamic RAM (DRAM) and Static RAM (SRAM).

Based on cell-array architecture, a flash memory may be classified as a NOR-type structure, where cells may be arranged in parallel between a bit line and a ground, or may be classified as a NAND-type structure, where cells may be arranged in series therebetween.

A NOR-type flash memory having a parallel structure may be used for booting a mobile phone, since it enables a high-speed random access on its reading operation.

The NAND-type flash memory having a serial structure may have a low reading speed, but it may have a high writing speed. In this respect, the NAND-type flash memory may be appropriate for data storage and may also be useful for miniaturization.

Flash memory may also be classified into a stack gate type and a split gate type on the basis of a unit cell structure.

According to a type of a charge storage layer, a flash memory may be classified into a floating gate device and a silicon-oxide-nitride-oxide-silicon (SONOS) device. A floating gate device may include a floating gate, which may be formed of polysilicon and may be covered with an insulator. In this case, a charge may be injected into or discharged from the floating gate by a channel hot carrier injector or Fowler-Nordheim (F-N) tunneling, whereby data may be stored in and erased from the floating gate.

In a related art flash memory device, a tunneling oxide layer may be positioned below a floating electrode. As this flash memory device is scaled-down, a gate height and a conjunction depth, as well as a channel length, may decrease and a tunneling oxide layer may also decrease in thickness.

However, there may be a limitation on the extent to which the tunneling oxide layer may be reduced in thickness. This may be because a thickness of tunneling oxide layer, through which the charge may be moved to the floating electrode, cannot be decreased to the extent below 7 nm or 8 nm.

If the tunneling oxide layer is too thin, the charge stored in the floating electrode may be discharged to a channel, which may reduce the ability of the memory to maintain the data.

Also, the flash memory devices may be arranged on a plane. If the devices cannot be scaled-down and if fewer devices may be provided, a memory storage capacity may be lowered in that degree.

Research and studies have been performed with respect to a three-dimensional flash memory. A unit cell of a three-dimensional flash memory may have multi-bit storage capacity and may overcome problems of the related art flash memory.

FIG. 1 is a cross sectional view illustrating a three-dimensional flash memory cell according to the related art.

As shown in FIG. 1, source and drain patterns 102 may be formed by removing predetermined portions of semiconductor substrate 101. Source and drain patterns 102 may be maintained at predetermined intervals. Source and drain patterns 102 may be formed by an impurity-ion implantation.

Tunneling capping layer 103 of an insulation layer may be formed on a surface of source and drain patterns 102. First polysilicon layer 104, which may become a floating gate, may be formed on substrate 101 including tunneling capping layer 103 and source and drain patterns 102.

A photoresist (not shown) may be coated onto first polysilicon layer 104. A photoresist pattern (not shown) may be formed between the source and drain patterns by photolithography.

By using the photoresist pattern as an etch-stopping layer, first polysilicon layer 104 formed between source and drain patterns 102 may be etched at a fixed interval, and may form a polysilicon pattern.

A related art three-dimensional flash memory formed as described herein may obtain a high level of integration of memory cells and also may also improve a scaling-down property. However, as shown in FIG. 1, a width difference between 'a' and 'b' patterns may inevitably form in the polysilicon pattern etched by the photoresist pattern due to the misalignment. The width difference of polysilicon pattern may badly affect the flash memory cell in its alignment, and may lower the memory capacity.

SUMMARY

Embodiments relate to flash memory technology, and more particularly, to a method of forming a three-dimensional flash memory cell.

Embodiments relate to a method of forming a flash memory cell, which may improve the uniformity of a flash memory cell by removing a width difference of a polysilicon pattern in a step of forming a floating gate of flash memory device. In embodiments, this may improve the reliability of a semiconductor device.

Embodiments relate to a method of forming a flash memory cell which may improve a yield due to a simplified process that may use a self-alignment method when forming a polysilicon pattern.

In embodiments, a method of forming a three-dimensional flash memory cell may include forming a plurality of source and drain patterns at fixed intervals on a semiconductor substrate, forming a tunneling capping layer on the surface of the plurality of source and drain patterns, forming a first polysilicon layer on the semiconductor substrate including the tunneling capping layer and the plurality of source and drain patterns, forming a hard mask on the first polysilicon layer, forming spacer-shaped etch-stopping layers at side walls of the plurality of source and drain patterns by etching the hard mask, forming a first polysilicon layer pattern by selectively etching the first polysilicon layer in state the spacer-shaped etch-stopping layer may be used as a mask, removing the etch-stopping layer, forming an insulation layer on the first polysilicon layer pattern, and forming a second polysilicon layer pattern on the insulation layer.

In embodiments, the hard mask may be formed of $SiO_2$ or $SiN_x$.

In embodiments, the hard mask may be etched by RIE, so as to form the etch-stopping layer.

In embodiments, the first polysilicon layer and the hard mask may be etched at a selection ratio of 10~20 to 1 when etching the first polysilicon layer.

In embodiments, the three-dimensional source and drain patterns protruding in the linear type may be formed on the semiconductor substrate.

In embodiments, the insulation layer may be formed in a deposition structure of oxide-nitride-oxide (ONO).

DRAWINGS

DETAILED DESCRIPTION

Although not illustrated in FIG. 2A, a method of forming source and drain patterns 202 on semiconductor substrate 201 will be described.

An insulation layer may be deposited on semiconductor substrate 201, and a photoresist may be coated onto the insulation layer. Photoresist patterns may be formed at fixed intervals by using a mask (not shown) above semiconductor substrate 201 including the insulation layer and the photoresist. This may be performed by photolithography using the mask (not shown) above semiconductor substrate 201.

The insulation layer may be etched by using the photoresist pattern as an etch-stopping layer, and the photoresist pattern may be removed. Impurity ions may be implanted using the insulation layer as an ion-implantation mask. Predetermined portions of the semiconductor substrate, into which the impurity ions may not be implanted, may be etched by an etching process.

Figure 1:
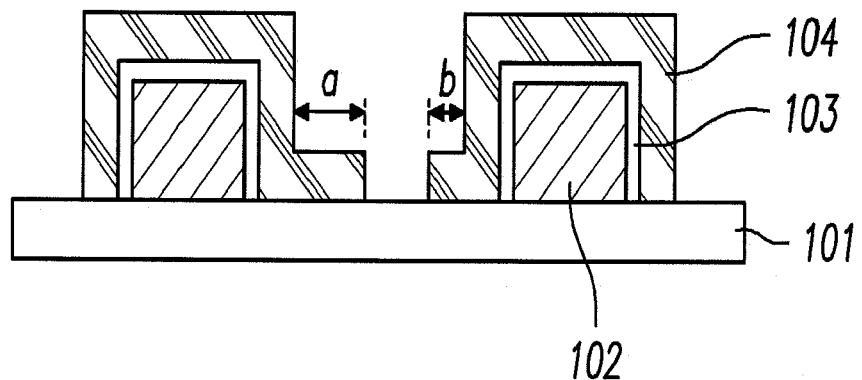
FIG. 1 is a cross section view illustrating a three-dimensional flash memory cell according to the related art.
Figure 2A:
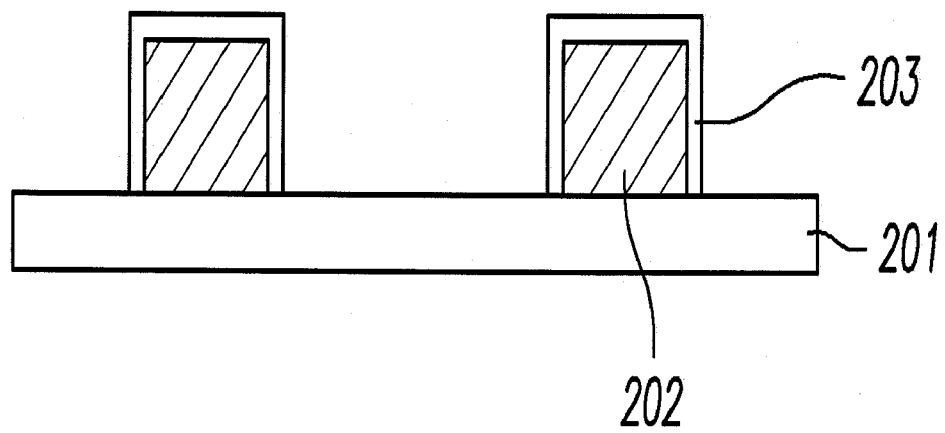
FIGS. 2A to 2F are cross section drawings illustrating a three-dimensional flash memory cell and a method of forming a three-dimensional flash memory cell according to embodiments.

Referring to FIG. 2A, the impurity ions may be implanted into semiconductor substrate 201, and source and drain patterns 202 may thus be formed at fixed intervals.

Tunneling capping layer 203 of an insulation layer may be formed on source and drain patterns 202. Three-dimensional source and drain patterns 202 protruding in the linear type may thus be formed on semiconductor substrate 201.

Figure 2B:
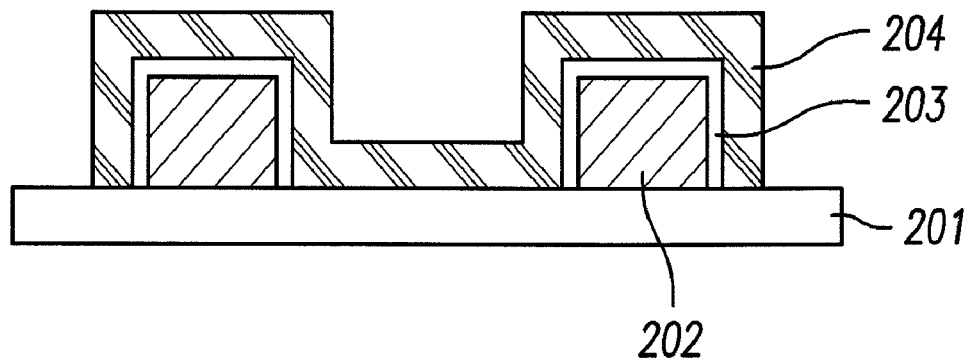

Referring to FIG. 2B, first polysilicon layer 204 may be conformally formed on semiconductor layer 201 including tunneling capping layer 203 and source and drain patterns 202. First polysilicon layer 204 may function as a floating gate.

Figure 2C:
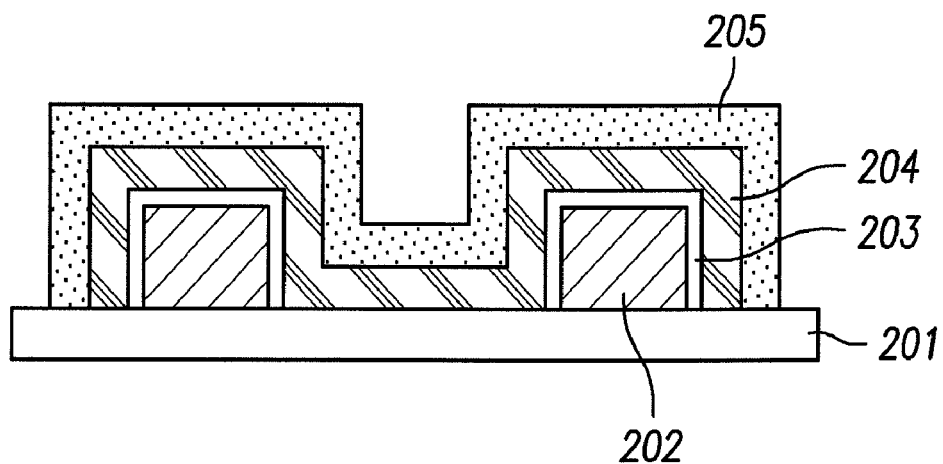

Referring to FIG. 2C, hard mask 205 may be formed on first polysilicon layer 204. In embodiments, hard mask 205 may be formed of $SiO_2$ or SiNx.

Figure 2D:
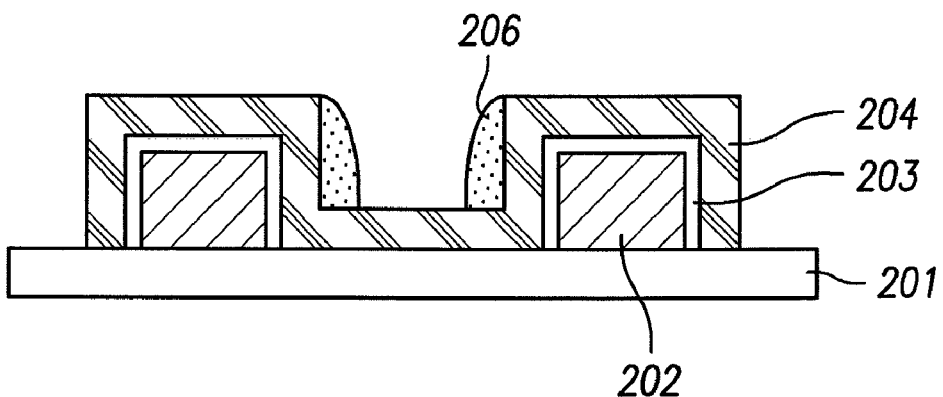

Referring to FIG. 2D, in embodiments, hard mask 205 may be selectively etched by a reactive ion etcher (RIE) process, and may thereby form spacer-shaped etch-stopping layers 206 at side walls of source and drain patterns 202. In embodiments, the RIE process may correspond to an anisotropic etching which may have a high reaction speed in a vertical direction and a low reaction speed in a horizontal direction. The RIE process may have a rapid etching speed and a good etching selection ratio. In embodiments, an etching gas for the RIE process may include $CF_4$, $CHF_4$ or fluorocarbon compounds.

Although not shown, in embodiments, a photoresist may be formed on source and drain patterns 202 except spacer-shaped etch-stopping layers 206 formed at side walls of source and drain patterns 202. The photoresist may be used as a mask (not shown).

If the first polysilicon layer 204 is etched thereafter, it may be possible to prevent undesired portions from being etched and damaged.

Figure 2E:
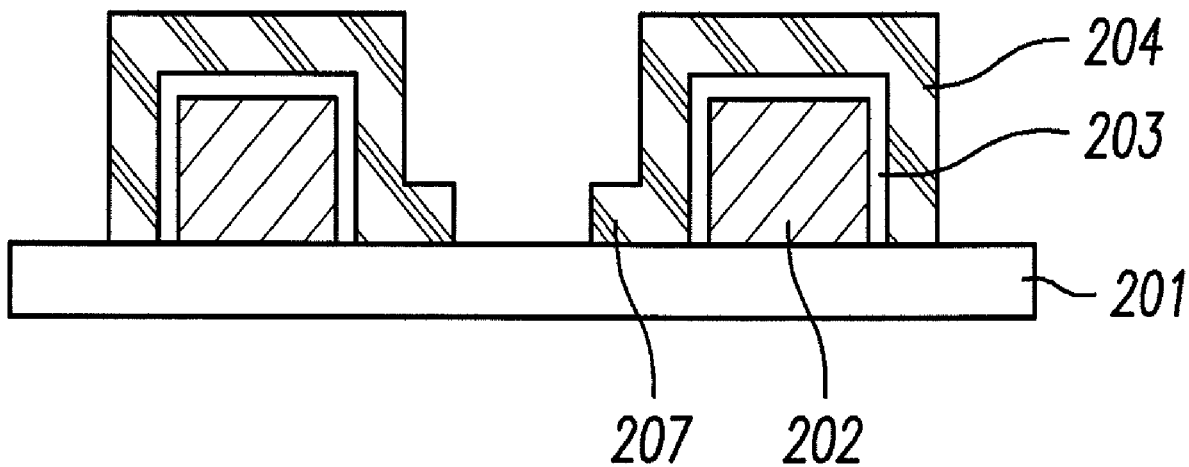

Referring to FIG. 2E, first polysilicon layer 204 may be etched in parallel between source and drain patterns 202 by using etch-stopping layer 206 as a mask, and may form first polysilicon layer pattern 207. In embodiments, first polysilicon layer 204 and the hard mask 205 may be etched at a selection ratio of approximately 10~20 to 1.

Because first polysilicon layer pattern 207 may be formed by a self-alignment, the floating gate may be formed with a substantially uniform pattern width.

Etch-stopping layer 206 may be removed by RIE.

Figure 2F:
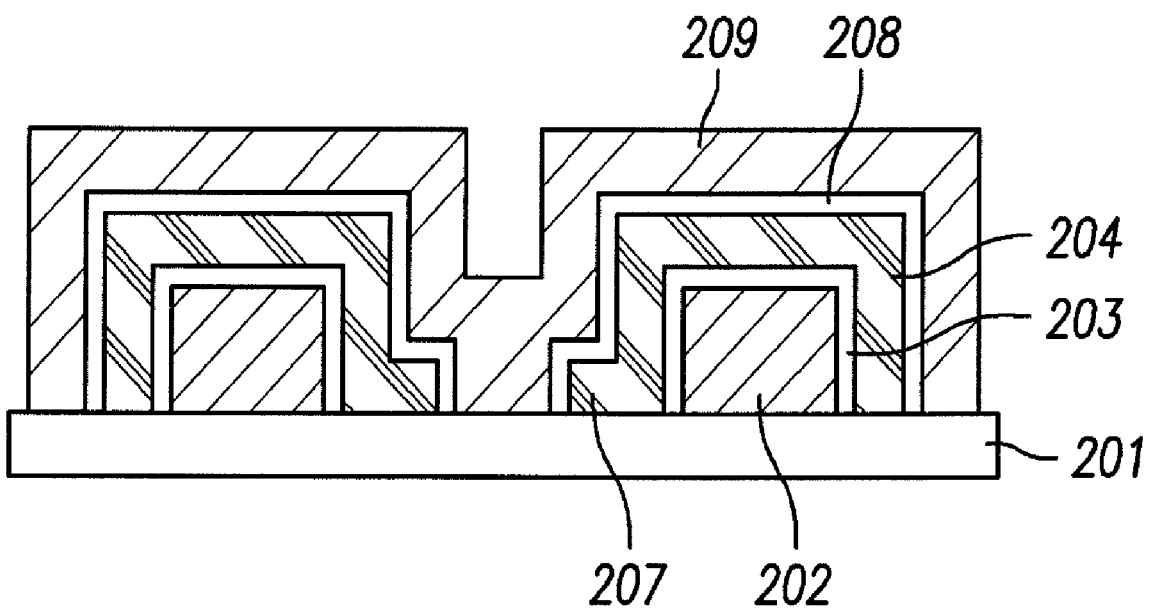

Referring to FIG. 2F, gate oxide layer 208 and second polysilicon layer pattern 209 may be sequentially formed on first polysilicon layer pattern 207 self-aligned. In embodiments, gate oxide layer 208 may be formed in a deposition structure of oxide-nitride-oxide (ONO). In embodiments, second polysilicon layer 209, which may function as a control gate, may be coated onto a surface, for example an entire surface, of the semiconductor substrate having the aforementioned elements in a direction of a ward line.

In embodiments, the method of forming the three-dimensional flash memory cell may have certain advantages.

For example, when forming the floating gate of the flash memory device, the first polysilicon layer may be etched by the anisotropic RIE process using the spacer-shaped hard mask of $SiO_2$ or SiNx as the etch-stopping layer, and may form a uniform polysilicon pattern self-aligned.

According to the uniform polysilicon pattern self-aligned, it may be possible to prevent the floating gate from being misaligned, which may improve the efficiency of flash memory device. Also, the process may be simplified owing to the uniform polysilicon pattern self-aligned, thereby improving the yield.

It will be apparent to those skilled in the art that various modifications and variations can be made to embodiments. Thus, it may be intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
    forming a plurality of source and drain patterns at fixed intervals on a semiconductor substrate;
    forming a tunneling capping layer over a surface of the plurality of source and drain patterns;
    forming a first polysilicon layer over the semiconductor substrate;
    forming spacer-shaped etch-stopping layers at side walls of the plurality of source and drain patterns; and
    forming a first polysilicon layer pattern by selectively etching the first polysilicon layer using the spacer-shaped etch-stopping layer as a mask.

2. The method of claim 1, further comprising:
    removing the etch-stopping layer;
    forming an insulation layer over the first polysilicon layer pattern; and
    forming a second polysilicon layer pattern over the insulation layer.

3. The method of claim 2, wherein the insulation layer is formed in a deposition structure of oxide-nitride-oxide (ONO).

4. The method of claim 1, further comprising:
    forming a hard mask over the first polysilicon layer; and
    forming the spacer-shaped etch-stopping layers at side walls of the plurality of source and drain patterns by etching the hard mask.

5. The method of claim 4, wherein the hard mask comprises at least one of $SiO_2$ and SiNx.

6. The method of claim 4, wherein the hard mask is etched by a reactive ion etch (RIE) process, to form the etch-stopping layer.

7. The method of claim 4, wherein the first polysilicon layer and the hard mask are etched at a selection ratio of 10~20 to 1 when etching the first polysilicon layer.

8. The method of claim 1, wherein the source and drain patterns comprise three-dimensional source and drain patterns protruding in a linear pattern and formed over the semiconductor substrate.

9. A method, comprising:
 forming a hard mask over a first poly-silicon layer over a semiconductor substrate;
 forming spacer-shaped etch-stopping layers at side walls of a plurality of source and drain patterns formed over the semiconductor substrate by etching the hard mask;
 forming a first polysilicon layer pattern by selectively etching the first polysilicon layer using the spacer-shaped etch-stopping layer as a mask; and
 removing the spacer-shaped etch-stopping layers, wherein the hard mask comprises at least one of $SiO_2$ and SiNx and is etched by a reactive ion etch (RIE) process to form the etch-stopping layer.

10. The method of claim 9, wherein the first polysilicon layer and the hard mask are etched at a selection ratio of 10~20 to 1 when etching the first polysilicon layer.

11. The method of claim 9, further comprising:
 forming an insulation layer over the first polysilicon layer pattern; and
 forming a second polysilicon layer pattern over the insulation layer.

12. The method of claim 9, wherein the RIE process has a higher reaction speed in a vertical direction than in a horizontal direction.

13. The method of claim 9, further comprising forming a tunneling capping layer over a surface of the plurality of source and drain patterns and between the plurality of source and drain patterns and the first polysilicon layer pattern.

14. The method of claim 9, wherein the source and drain patterns comprise three-dimensional source and drain patterns extending in a linear pattern and formed over the semiconductor substrate.

* * * * *